United States Patent
Fujii et al.

(10) Patent No.: US 8,278,644 B2
(45) Date of Patent: Oct. 2, 2012

(54) SWITCHING DEVICE AND NONVOLATILE MEMORY DEVICE

(75) Inventors: Shosuke Fujii, Kanagawa-ken (JP); Koichi Muraoka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 258 days.

(21) Appl. No.: 12/710,942

(22) Filed: Feb. 23, 2010

(65) Prior Publication Data

US 2010/0213435 A1    Aug. 26, 2010

(30) Foreign Application Priority Data

Feb. 24, 2009    (JP) .................................. 2009-040924

(51) Int. Cl.
*H01L 29/06*    (2006.01)
(52) U.S. Cl. ..................... 257/9; 257/314; 257/E29.155; 257/E29.168
(58) Field of Classification Search ............... 257/9, 314, 257/E29.255, E29.168
See application file for complete search history.

(56) References Cited

U.S. PATENT DOCUMENTS

2011/0068290 A1* 3/2011 Haddon et al. ......... 252/62.51 R

OTHER PUBLICATIONS

Echtermeyer et al.; "Nonvolatile Switching in Graphene Field-Effect Devices", IEEE Electron Device Letters, vol. 29, No. 8, pp. 952-954, (2008).
Echtermeyer et al.; "A Graphene-Based Electrochemical Switch", arXiv 0712.2026V1, pp. 1-12.
Echtermeyer et al., "A graphene-based electrochemical switch," Dec. 12, 2007, arXiv 0712.2026V1, pp. 1-12.

* cited by examiner

*Primary Examiner* — Eugene Lee
*Assistant Examiner* — Elias M Ullah
(74) *Attorney, Agent, or Firm* — Finnegan, Henderson, Farabow, Garrett & Dunner, L.L.P.

(57) ABSTRACT

A switching device includes: a first layer including a carbon material having a six-member ring network structure; a first electrode electrically connected to a first portion of the first layer; a second electrode electrically connected to a second portion of the first layer and provided apart from the first electrode; a third electrode including a fourth portion provided opposing a third portion between the first portion and the second portion of the first layer; and a second layer provided between the third portion of the first layer and the fourth portion of the third electrode. The second layer includes: a base portion; and a functional group portion. The functional group portion is provided between the base portion and the first layer. The functional group portion is bonded to the base portion. A ratio of $sp^2$-bonded carbon and $sp^3$-bonded carbon of the first layer is changeable by a voltage applied between the first layer and the third electrode.

18 Claims, 8 Drawing Sheets

SWITCHING DEVICE AND NONVOLATILE MEMORY DEVICE

CROSS-REFERENCE TO RELATED APPLICATIONS

This application is based upon and claims the benefit of priority from the prior Japanese Patent Application No. 2009-040924, filed on Feb. 24, 2009; the entire contents of which are incorporated herein by reference.

BACKGROUND OF THE INVENTION

1. Field of the Invention

The invention relates to a switching device and a nonvolatile memory device.

2. Background Art

In recent years, the demand for compact memory devices having large capacities typified by NAND flash memory has rapidly increased, and much development is being performed with goals of high bit density and increased capacity. Generally, the capacity of semiconductor memory is increased by downscaling the individual memory elements. However, conventional semiconductor memory technology is reaching limits of downscaling from the viewpoint of operation principles and from the viewpoint of manufacturing cost. Accordingly, the realization of a next-generation memory based on a new operation principle is desired to further increase memory device capacity.

For example, electrochemical switches utilizing graphene (for example, refer to "A graphene-based electrochemical switch," arXiv 0712.2026V1 and "Nonvolatile Switching in Graphene Field-Effect Device," IEEE Electron Device Letters, Vol. 29, No. 8, pp. 952-954, August 2008) are considered to be candidates for the next-generation memory that may break through the downscaling limits of conventional semiconductor memory due to their large ON/OFF ratios, nonvolatile properties, and the like.

However, because such conventional technologies utilize electrochemical reactions of water molecules mixed in an insulating film as the reactive substance, the control of the type, position, amount, etc., of the reactive substance is insufficient; the reliability and the yields of the devices are problematic; and many challenges remain before practical use will be achieved.

SUMMARY OF THE INVENTION

According to an aspect of the invention, there is provided a switching device, including: a first layer including a carbon material having a six-member ring network structure; a first electrode electrically connected to a first portion of the first layer; a second electrode electrically connected to a second portion of the first layer and provided apart from the first electrode; a third electrode including a fourth portion provided opposing a third portion between the first portion and the second portion of the first layer; and a second layer provided between the third portion of the first layer and the fourth portion of the third electrode, the second layer including: a base portion; and a functional group portion, the functional group portion being provided between the base portion and the first layer, the functional group portion being bonded to the base portion, a ratio of $sp^2$-bonded carbon and $sp^3$-bonded carbon of the first layer being changeable by a voltage applied between the first layer and the third electrode.

According to another aspect of the invention, there is provided a nonvolatile memory device, including: memory cells, each of the memory cells including a switching device including: a first layer including a carbon material having a six-member ring network structure; a first electrode electrically connected to a first portion of the first layer; a second electrode electrically connected to a second portion of the first layer and provided apart from the first electrode; a third electrode including a fourth portion provided opposing a third portion between the first portion and the second portion of the first layer; and a second layer provided between the third portion of the first layer and the fourth portion of the third electrode, the second layer including: a base portion; and a functional group portion, the functional group portion being provided between the base portion and the first layer, the functional group portion being bonded to the base portion, a ratio of $sp^2$-bonded carbon and $sp^3$-bonded carbon of the first layer being changeable by a voltage applied between the first layer and the third electrode, a change of an electrical conductivity of the first layer accompanying the change of the ratio of $sp^2$-bonded carbon and $sp^3$-bonded carbon being maintainable as stored data.

According to another aspect of the invention, there is provided a switching device, comprising: a first layer including a carbon material having a six-member ring network structure; a first electrode electrically connected to a first portion of the first layer; a second electrode electrically connected to a second portion of the first layer and provided apart from the first electrode; a third electrode including a fourth portion provided opposing a third portion between the first portion and the second portion of the first layer; and a second layer provided between the third portion of the first layer and the fourth portion of the third electrode, the second layer including: a base portion; and a functional group portion, the functional group portion being provided between the base portion and the first layer, the functional group portion being bonded to the base portion, a ratio of $sp^2$-bonded carbon and $sp^3$-bonded carbon of the first layer being changeable by a current flowing in the first layer via the first electrode and the second electrode.

According to another aspect of the invention, there is provided a nonvolatile memory device, including: memory cells, each of the memory cells including a switching device including: a first layer including a carbon material having a six-member ring network structure; a first electrode electrically connected to a first portion of the first layer; a second electrode electrically connected to a second portion of the first layer and provided apart from the first electrode; a third electrode including a fourth portion provided opposing a third portion between the first portion and the second portion of the first layer; and a second layer provided between the third portion of the first layer and the fourth portion of the third electrode, the second layer including: a base portion; and a functional group portion, the functional group portion being provided between the base portion and the first layer, the functional group portion being bonded to the base portion, a ratio of $sp^2$-bonded carbon and $sp^3$-bonded carbon of the first layer being changeable by a current flowing in the first layer via the first electrode and the second electrode, a change of an electrical conductivity of the first layer accompanying the change of the ratio of $sp^2$-bonded carbon and $sp^3$-bonded carbon being maintainable as stored data.

DETAILED DESCRIPTION OF THE INVENTION

Embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification of the application and the drawings, components similar to those described in regard to a drawing thereinabove are marked with like reference numerals, and a detailed description is omitted as appropriate.

First Embodiment

Figure 1:
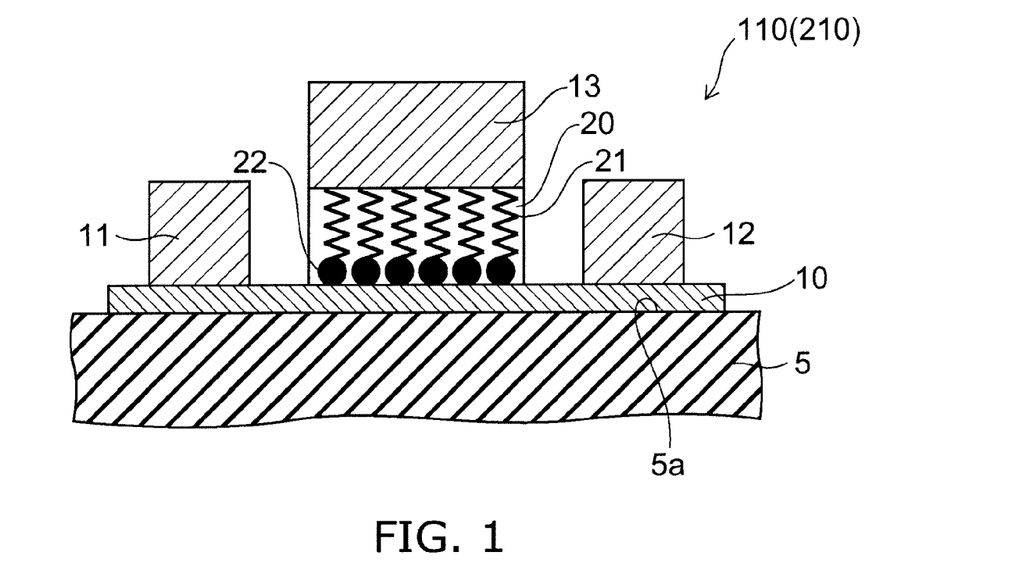
FIG. 1 is a schematic cross-sectional view illustrating the configuration of a switching device according to a first embodiment of the invention.

FIG. 1 is a schematic cross-sectional view illustrating the configuration of a switching device according to a first embodiment of the invention.

FIG. 1 also illustrates the configuration of a nonvolatile memory device according to a second embodiment of the invention described below.

As illustrated in FIG. 1, a switching device 110 according to the first embodiment of the invention includes a first layer 10, a second layer 20, a first electrode 11, a second electrode 12, and a third electrode 13.

The first layer 10 is provided on, for example, a major surface 5a of a substrate 5. The first layer 10 is made of a carbon material including a six-member ring network structure.

In other words, graphite, carbon nanotubes, and the like, for example, may be used as the first layer 10. Carbon nanohorns and carbon nanowalls also may be used. In the specification of the application, "graphite" includes graphene, carbon nanohorns, and carbon nanowalls.

In other words, the first layer 10 may have a configuration of mainly $sp^2$-bonded carbon such as the configurations of graphite and carbon nanotubes; and it is more favorable to use a material such as single-layer carbon nanotubes and graphene having an electrical conductivity that greatly changes with the adsorption of a substance.

The first electrode 11 is provided on the first layer 10. The second electrode 12 is provided on the first layer 10 apart from the first electrode 11. The third electrode 13 is provided on the first layer 10 between the first electrode 11 and the second electrode 12.

However, the invention is not limited thereto. The first electrode 11 may be electrically connected to a first portion of the first layer 10; the second electrode 12 may be electrically connected to a second portion of the first layer 10 and provided apart from the first electrode 11; the third electrode 13 may be provided opposing a third portion between the first portion and the second portion of the first layer 10; and the mutual dispositions among the first electrode 11, the second electrode 12, and the third electrode 13 and the dispositions with respect to the first layer 10 are arbitrary. For example, the electrodes may be provided to enclose the first layer 10.

The first electrode 11 forms, for example, a source electrode. The second electrode 12 forms, for example, a drain electrode. The third electrode 13 forms, for example, a gate electrode. The first electrode 11 and the second electrode 12 are mutually interchangeable.

A second layer 20 is provided between the first layer 10 and the third electrode 13.

The second layer 20 includes a base portion 21 and a functional group portion 22 bonded to the base portion 21. The functional group portion 22 opposes the first layer 10. In other words, the functional group portion 22 is provided between the base portion 21 and the first layer 10.

The base portion 21 is a portion having a position with respect to the first layer 10 that substantially does not change. Conversely, the functional group portion 22 has a position changeable with respect to the first layer 10. However, the functional group portion 22 is bonded to the base portion 21 and therefore does not have an arbitrary position in the second layer 20. In other words, the functional group portion 22 has a changeable distance to carbon atoms included in the opposing first layer 10 while being bonded to the base portion 21.

Although the base portion 21 bonded to the functional group portion 22 also undergoes a slight contraction change when the distance between the functional group portion 22 and the first layer 10 (specifically, the carbon atoms included in the first layer 10) changes, the contraction is small and therefore can be ignored; and the base portion 21 is taken to have a position that substantially does not change. The distance between the functional group portion 22 and the carbon atoms included in the first layer 10 is changed by a shift of the position of the carbon atoms included in the first layer 10. The position of the functional group portion 22 may also be shifted in some cases.

The ratio of the $sp^2$-bonded carbon and the $sp^3$-bonded carbon of the first layer 10 is changeable by the functional group portion 22 by the change of the distance between the functional group portion 22 and the carbon atoms in the first layer 10.

The change of the distance between the functional group portion 22 and the carbon atoms in the first layer 10 recited above may be produced, for example, by a voltage applied between the first layer 10 and the third electrode 13. In other words, in the switching device 110, the ratio of the $sp^2$-bonded carbon and the $sp^3$-bonded carbon of the first layer 10 is changeable by the voltage applied between the first layer 10 and the third electrode 13.

Also, the change of the distance between the functional group portion 22 and the carbon atoms in the first layer 10 may be produced by a current flowing in the first layer 10 via the first electrode 11 and the second electrode 12. In other words, in the switching device 110, the ratio of the $sp^2$-bonded carbon and the $sp^3$-bonded carbon of the first layer 10 is changeable by the current flowing in the first layer 10 via the first electrode 11 and the second electrode 12.

The case will now be described where the change of the distance between the functional group portion 22 and the carbon atoms in the first layer 10 and the accompanying change of the ratio of the $sp^2$-bonded carbon and the $sp^3$-bonded carbon of the first layer 10 are produced by the voltage applied between the first layer 10 and the third electrode 13.

An organic monolayer film, for example, may be used as the second layer 20. However, any configuration may be used for the second layer 20 as long as the second layer 20 includes the base portion 21 and the functional group portion 22, where the functional group portion 22 is bonded to the base portion 21 and provided between the base portion 21 and the first layer 10. As an example, the case will now be described where an organic monolayer film is used as the second layer 20.

The organic monolayer film used as the second layer 20 is a film in which organic molecules are in a closely packed state with aligned orientations due to the intermolecular interactions among the organic molecules, e.g., Van der Waals forces and/or hydrophobic interactions among alkyl chains, n-electron interactions among benzene rings, etc. In other words, the organic monolayer film is, for example, an LB film (Langmuir-Blodgett film) or a SAM (Self-assembled Monolayer).

The case will now be described where the second layer 20 is taken to be an organic monolayer film.

The organic monolayer film includes the base portion 21 and the functional group portion 22. The base portion 21 includes, for example, long chain alkyl groups and the like; and functional groups described below are bonded to the ends of the base portion 21. In the organic monolayer film, the base portion 21 is disposed on the third electrode 13 side, and the functional group portion 22 is disposed on the first layer 10 side to oppose the first layer 10.

The base portion 21 of the organic monolayer film is mutually affixed by mutual Van der Waals forces and the like, and the position of the base portion 21 is substantially unchanging.

Interactions are possible between the functional group portion 22 and the π orbital electrons of the carbon atoms included in the first layer 10. In other words, an interaction is possible between the functional group portion 22 and the π bonds of the carbon atoms included in the first layer 10, i.e., the molecular orbitals made by overlapping pz orbitals among the carbon atoms.

The functional group portion 22 includes a functional group such as, for example, hydroxyl group, carboxyl group, aldehyde group, amino group, nitro group, nitroso group, isocyano group, cyano group, thiol group, phosphonic acid group, vinyl group, alkynyl group, and epoxy group.

Of the functional groups recited above, the functional groups including oxygen easily interact with the carbon atoms included in the first layer 10 and therefore are more desirable to use as the functional group portion 22.

By using such an organic monolayer film having the functional group portion 22 on the ends thereof, a functional group portion 22 that interacts with the π orbital electrons of the carbon atoms is disposed on the first layer 10 side.

Figure 2A:
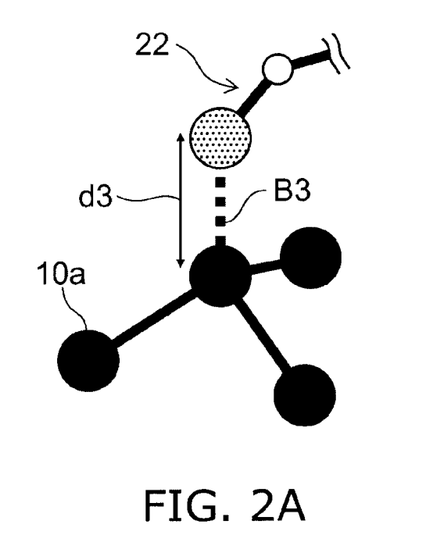
FIGS. 2A and 2B are schematic views illustrating operations of the switching device according to the first embodiment of the invention.
Figure 2B:
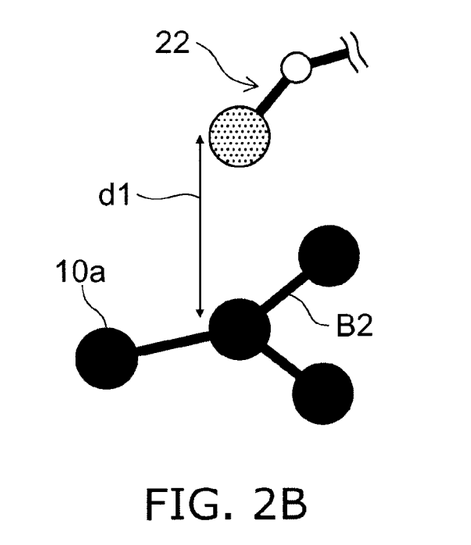

FIGS. 2A and 2B are schematic views illustrating operations of the switching device according to the first embodiment of the invention.

Namely, FIGS. 2A and 2B illustrate two states of the switching device 110. FIG. 2A illustrates the state in which the distance between the carbon atoms included in the first layer 10 and the functional group portion 22 in the second layer 20 is short. FIG. 2B illustrates the state in which the distance is long.

As illustrated in FIG. 2A, in the state in which the distance between carbon atoms 10a included in the first layer 10 and the functional group portion 22 in the second layer 20 is short, the carbon atoms 10a have a tetrahedral structure with $sp^3$ bonds B3 and are proximal to the functional group portion 22. Therefore, a distance d3 between the functional group portion 22 and the carbon atoms 10a is a value near the distance of a general $sp^3$ bond of carbon of 1.54 angstroms.

On the other hand, as illustrated in FIG. 2B, in the state in which the distance between the carbon atoms 10a included in the first layer 10 and the functional group portion 22 in the second layer 20 is long, the carbon atoms 10a form $sp^2$ bonds B2 and are not proximal to the functional group portion 22. Therefore, a distance d1 between the functional group portion 22 and the carbon atoms 10a is longer than the distance of an $sp^3$ bond (about 1.54 angstroms).

In other words, when the functional group portion 22 is proximal to the carbon atoms 10a of the first layer 10, e.g., when the functional group portion 22 is adsorbed to the first layer 10, the carbon atoms 10a of the first layer 10 form $sp^3$ bonds B3. Then, when the functional group portion 22 is apart from the carbon atoms 10a of the first layer 10, e.g., when the functional group portion 22 is desorbed from the first layer 10, the carbon atoms 10a of the first layer 10 form $sp^2$ bonds B2.

The change between the functional group portion 22 and the carbon atoms 10a may be a change of the position of the carbon atoms 10a. Also, a slight contraction of the base portion 21 may occur and thereby cause the position of the functional group portion 22 to change. In such a case, the change of the contraction of the base portion 21 is small; and therefore, the position of the base portion 21 may be considered to have substantially no change.

Thus, in the switching device 110, the ratio of the $sp^2$-bonded carbon and the $sp^3$-bonded carbon of the first layer 10 is changeable by the change of the distance between the functional group portion 22 and the carbon atoms 10a included in the first layer 10.

The electrical conductivity of the first layer 10 changes with the ratio of the $sp^2$-bonded carbon and the $sp^3$-bonded carbon of the first layer 10. In other words, the electrical conductivity of the first layer 10 decreases when the ratio of the $sp^3$-bonded carbon relatively increases. Conversely, the electrical conductivity of the first layer 10 increases when the ratio of the $sp^2$-bonded carbon relatively increases.

The distance between the carbon atoms 10a included in the first layer 10 and the functional group portion 22 may be controlled, for example, by applying the voltage between the first layer 10 and the third electrode 13.

The case will now be described where an applied voltage, i.e., a potential of the third electrode 13 when the first layer 10 is a reference, is applied to the third electrode 13.

For example, in the case where the functional group portion 22 is a hydroxyl group, a negative applied voltage is applied to the third electrode 13 (that is, such that the third electrode 13 has a negative potential when the first layer 10 is a reference); and thereby, the functional group portion 22 moves proximally to the carbon atoms 10a of the first layer 10, and the functional group portion 22 adsorbs, for example, to the carbon atoms 10a. Conversely, by applying a positive applied voltage to the third electrode 13, the functional group portion 22 moves apart from the carbon atoms 10a of the first layer 10, and the functional group portion 22 desorbs from the carbon atoms 10a.

Thus, according to the switching device 110, the distance between the functional group portion 22 and the carbon atoms 10a is controlled by the voltage applied between the first layer 10 and the third electrode 13; the ratio of the $sp^2$-bonded carbon and the $sp^3$-bonded carbon is controlled; the accompanying electrical conductivity of the first layer 10 is controlled; and as a result, the current provided between the first electrode 11 and the second electrode 12 can be controlled.

Because the change of the distance between the functional group portion 22 and the carbon atoms 10a recited above is performed in the state in which the functional group portion 22 is bonded to the affixed base portion 21, the reproducibility and the reliability are high; effects do not easily occur due to fluctuation of the manufacturing processes of the switching device 110, due to the surrounding environment, etc.; and therefore, the fluctuation among devices is small.

The change of the distance between the functional group portion 22 and the carbon atoms 10a is reversible; the change of the ratio of the $sp^2$-bonded carbon and the $sp^3$-bonded carbon is reversible; and the accompanying change of the electrical conductivity of the first layer 10 is reversible.

The change of the distance between the functional group portion 22 and the carbon atoms 10a caused by, for example, the potential difference between the first layer 10 and the third electrode 13 is nonvolatile until another potential difference is applied between the first layer 10 and the third electrode 13 to bring about a change of the distance between the functional group portion 22 and the carbon atoms 10a. Accordingly, the change of the ratio of the $sp^2$-bonded carbon and the $sp^3$-bonded carbon also is nonvolatile, and the accompanying change of the electrical conductivity of the first layer 10 also is nonvolatile. In other words, these are nonvolatile until, for example, a potential necessary for a reverse reaction is applied.

Accordingly, by the switching device 110, a nonvolatile memory device can be formed in which the change of the electrical conductivity of the first layer 10 accompanying the change of the ratio of the $sp^2$-bonded carbon and the $sp^3$-bonded carbon caused by the change of the distance between the functional group portion 22 and the carbon atoms 10a is maintainable as stored data.

Comparative Example

Figure 3:
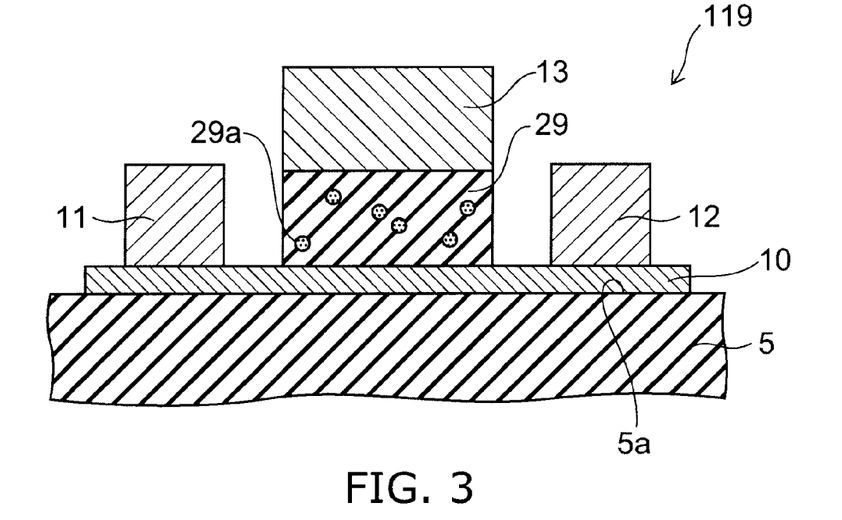
FIG. 3 is a schematic cross-sectional view illustrating the configuration of a switching device of a comparative example.

FIG. 3 is a schematic cross-sectional view illustrating the configuration of a switching device of a comparative example.

As illustrated in FIG. 3, a switching device 119 of the comparative example includes the first layer 10, the first electrode 11, the second electrode 12, and the third electrode 13. The configuration thereof is similar to that of the switching device 110 according to this embodiment, and a description is omitted.

In the switching device 119 of the comparative example, a silicon oxide film 29 including water molecules 29a is provided between the first layer 10 and the third electrode 13. In other words, the switching device 119 corresponds to the configurations recited in "A graphene-based electrochemical switch," arXiv 0712.2026V1 and "Nonvolatile Switching in Graphene Field-Effect Device," IEEE Electron Device Letters, Vol. 29, No. 8, pp. 952-954, August 2008.

In the switching device 119 of the comparative example, when a voltage (i.e., a gate voltage) is applied between the first layer 10 (graphene) and the third electrode 13, an adsorption reaction or a desorption reaction occurs between the water molecules 29a included in the silicon oxide film 29 and the carbon atoms included in the first layer 10. For example, in the case of adsorption, the water molecules 29a move to the first layer 10 side; an interaction with π bonds of the surface of the first layer 10 occurs; and the bonding mode of the carbon atoms of the first layer 10 transforms from $sp^2$ bonds to $sp^3$ bonds. Conversely, in the case of the desorption reaction, the water molecules 29a adsorbed to the surface of the first layer 10 desorb from the surface of the first layer 10 and diffuse; and the carbon atoms of the portion where the water molecules 29a were adsorbed transform from $sp^3$ bonds to $sp^2$ bonds.

Thus, in the switching device 119 of the comparative example, the water molecules 29a mixed in the silicon oxide film 29 move in the second layer 20; and thereby, adsorption reactions and desorption reactions occur; and a transformation occurs between the $sp^2$ bonds and the $sp^3$ bonds of the carbon atoms included in the first layer 10. In other words, the movable water molecules 29a in the silicon oxide film 29 form the reactive species of the reactions.

In the switching device 119 of the comparative example, the water molecules 29a (the reactive species) move in the second layer 20 in a direction from the third electrode 13 side to the first layer 10 side or in its reverse direction or diffuse due to the concentration gradient and/or the applied electric field. Therefore, the number (the amount and/or concentration) of the water molecules 29a (the reactive species) existing proximally to the carbon atoms included in the first layer 10 is different depending on the timing of the application of the voltage to the third electrode 13. In other words, the number (the amount and/or concentration) of the water molecules 29a contributing to the change of the ratio of the $sp^2$-bonded carbon and the $sp^3$-bonded carbon easily fluctuates; and therefore, the characteristics are not stable and the reliability is low.

In other words, the switching device 119 of the comparative example utilizes an electrochemical reaction of the water molecules 29a mixed into the silicon oxide film 29; and therefore, the control of the position, the amount, etc., of the water molecules 29a (the reactive species) is insufficient; the reliability of the switching device 119 is low; the fluctuation among devices is large; and the yield is low. Further, in the case where impurities other than the water molecules 29a are included in the silicon oxide film 29, the impurities act as reactive species. Therefore, the characteristics are more unstable, and the fluctuation among devices also increases.

Even in the case where a substance other than the water molecules 29a is used as the reactive species in the silicon oxide film 29, similar problems occur if the reactive species can move or diffuse in the silicon oxide film 29.

Conversely, in the switching device 110 according to this embodiment and a nonvolatile memory device 210 described below, the change of the distance between the functional group portion 22 and the carbon atoms 10a is performed by the functional group portion 22 opposing the first layer 10 in the state of being bonded to the affixed base portion 21. Accordingly, the number (the amount and/or density) of the functional group portion 22 opposing the carbon atoms 10a included in the first layer 10 is constant. For example, the number (the amount and/or concentration) of the functional group portion 22 existing proximally to the carbon atoms 10a included in the first layer 10 is constant regardless of the timing of the application of the voltage to the third electrode 13. In other words, variation of the number (the amount and/or concentration) of the functional group portion 22 contributing to the change of the ratio of the $sp^2$-bonded carbon and the $sp^3$-bonded carbon resulting from the manufacturing processes fluctuation or occurring over time can be suppressed. Therefore, the switching device 110 can provide switching with high reliability and low fluctuation among devices.

Second Embodiment

A nonvolatile memory device according to a second embodiment of the invention has the structure of the switching device 110 described in the first embodiment.

In other words, as illustrated in FIG. 1, the nonvolatile memory device 210 according to the second embodiment includes: the first layer 10 made of a carbon material having a six-member ring network structure; the first electrode 11 electrically connected to a first portion of the first layer 10; the second electrode 12 electrically connected to a second portion of the first layer 10 and provided apart from the first electrode 11; the third electrode 13 including a portion (a fourth portion) provided opposing a third portion between the first portion and the second portion of the first layer 10; and the second layer 20 provided between the third portion of the first layer 10 and the fourth portion of the third electrode 13. The second layer 20 includes the base portion 21 and the functional group portion 22. The functional group portion 22 is provided between the base portion 21 and the first layer 10 and bonded to the base portion 21. The ratio of the $sp^2$-bonded carbon and the $sp^3$-bonded carbon of the first layer 10 is changeable by the functional group portion 22 by changing a distance between the functional group portion 22 and the carbon atoms included in the first layer 10.

The nonvolatile memory device 210 can maintain the change of the electrical conductivity of the first layer 10 accompanying the change of the ratio of the $sp^2$-bonded carbon and the $sp^3$-bonded carbon as stored data.

As described above, the change of the distance between the functional group portion 22 and the carbon atoms 10a, the change of the ratio of the $sp^2$-bonded carbon and the $sp^3$-bonded carbon, and the change of the electrical conductivity of the first layer 10 are reversible.

The change of the distance between the functional group portion 22 and the carbon atoms 10a occurring due to, for example, the potential difference between the first layer 10 and the third electrode 13 is nonvolatile until, for example, another potential difference is applied between the first layer 10 and the third electrode 13 to bring about a change of the distance between the functional group portion 22 and the carbon atoms 10a; and the change of the ratio of the $sp^2$-bonded carbon and the $sp^3$-bonded carbon and the change of the electrical conductivity of the first layer 10 also are nonvolatile. In other words, these are nonvolatile until, for example, a potential necessary for a reverse reaction is applied.

Storage unit data (the memory state) of the nonvolatile memory device 210 is read by a current (a current between the source and the drain) between the first electrode 11 and the second electrode 12 on the first layer 10. For example, in the state in which the distance between the functional group portion 22 and the carbon atoms 10a is short (e.g., adsorption), the resistance between the source and the drain increases because the proportion of the $sp^3$-bonded carbon included in the first layer 10 increases. On the other hand, in the state in which the distance between the functional group portion 22 and the carbon atoms 10a is long (e.g., desorption), the resistance between the source and the drain is low because the proportion of the $sp^3$-bonded carbon included in the first layer 10 decreases. Further, in the $sp^2$ bond state, the resistance between the source and the drain decreases because adjacent carbon atoms 10a form $\pi$ orbitals having high electrical conductivity.

For example, taking the state of high resistance (e.g., the state in which the functional group portion 22 is adsorbed to the carbon atoms 10a) as "0" and the state of low resistance (e.g., the state in which the functional group portion 22 is desorbed from the carbon atoms 10a) as "1," the memory state of the nonvolatile memory device 210 can be determined by detecting the current between the source and the drain.

According to the nonvolatile memory device 210, a nonvolatile memory device having high reliability and low fluctuation among devices can be provided.

In the switching device 110 and the nonvolatile memory device 210 according to the first and second embodiments, for example, an adsorption reaction or a desorption reaction can be caused to occur between the functional group portion 22 in the second layer 20 and the carbon atoms 10a included in the first layer 10 by an electric field or voltage assist by, for example, applying a voltage to the third electrode 13.

In such a case, the applied voltage changes with the type of the functional group portion 22 and the layer thickness of the second layer 20. In the operation of the switching device 110 and the nonvolatile memory device 210, a voltage in the range of, for example, −10 volts to +10 volts may be applied to the third electrode 13. In the case where the layer thickness of the second layer 20 is thin and/or in the case where a material having a low resistance to dielectric breakdown is used as the second layer 20, a voltage in the range of, for example, −6 volts to +6 volts may be applied to the third electrode 13.

The change of the distance between the functional group portion 22 and the carbon atoms 10a is, for example, an adsorption reaction and a desorption reaction. An oxidation-reduction reaction is one example of an adsorption reaction and a desorption reaction.

In the case of an oxidation-reduction reaction, an oxidation reaction occurs to remove electrons from the functional group portion 22 side into the first layer 10 when a negative voltage is applied to the third electrode 13. Then, a reduction reaction occurs to supply electrons from the first layer 10 to the functional group portion 22 side when a positive voltage is applied to the third electrode 13. By these oxidation-reduction reactions, an adsorption/desorption reaction occurs between the functional group portion 22 and the carbon atoms 10a. The distance between the functional group portion 22 and the carbon atoms 10a changes due to the difference of the bonding states of the adsorption state and the desorption state.

For example, in the case where the first layer 10 is a carbon nanotube formed of $sp^2$-bonded carbon, the electrical conductivity of the first layer 10 decreases to about half when an adsorption reaction causes 1 ppm of the $sp^2$-bonded carbon to transform to $sp^3$-bonded carbon. Accordingly, to change the electrical conductivity by a factor of two or more, it is sufficient to increase the concentration of the $sp^3$-bonded carbon 1 ppm or more.

In the case where an even greater change of the electrical conductivity is to be obtained to bring out even higher performance of the switching device and the nonvolatile memory device, the change of the concentration of the $sp^3$-bonded carbon may be, for example, 10% or more.

In the case where an organic monolayer film is used as the second layer 20, the thickness of the second layer 20 can be made to the desired thickness by appropriately selecting an organic molecule forming the organic monolayer film. In other words, the thickness of the organic monolayer film is determined by the length of the organic molecule forming the organic monolayer film.

Longer organic molecules can be packed closely in the monolayer film because the interactions among the organic molecules increase. In the case where the organic molecule is short, the interactions among molecules are weak, and the molecules are not closely integrated which causes fluctuation among devices. It is favorable that the film thickness of the organic monolayer film used for the second layer 20 is not less than 0.5 nm. To pack more closely, it is desirable to be not less than 1 nm.

In the case where the organic monolayer film is used as the second layer 20, the base portion 21 of the organic monolayer film is disposed on the third electrode 13 side; the functional group portion 22 is disposed on the first layer 10 side; and the organic molecules are closely packed in the organic monolayer film due to the interactions among the organic molecules. Therefore, the density of the functional group portion 22 at the plane on the side opposing the first layer 10 can be increased; and the characteristics of the switching device 110 and the nonvolatile memory device 210 can be improved.

Any conductive material may be used as the third electrode 13. The third electrode 13 may include, for example, metal material, semiconductor material such as silicon doped with an impurity, carbon material having a high electrical conductivity such as graphite, and the like. Examples of metal materials include single elements such as Au, Pt, Al, Ta, Ti, and W and silicides, nitrides, carbides, and the like thereof. Such metal materials may be applied to the third electrode 13 in a stacked structure.

The ratio of the $sp^2$-bonded carbon and the $sp^3$-bonded carbon of the carbon atoms 10a included in the first layer 10 can be analyzed, for example, by X-ray photoelectron spectroscopy (XPS), ultra-violet photoelectron spectroscopy (UPS), infrared spectroscopy, electron energy-loss spectroscopy (EELS, TEM-EELS, STEM-EELS), and the like.

First Example

A switching device and a nonvolatile memory device of a first example according to the first and second embodiments will now be described.

Figure 4:
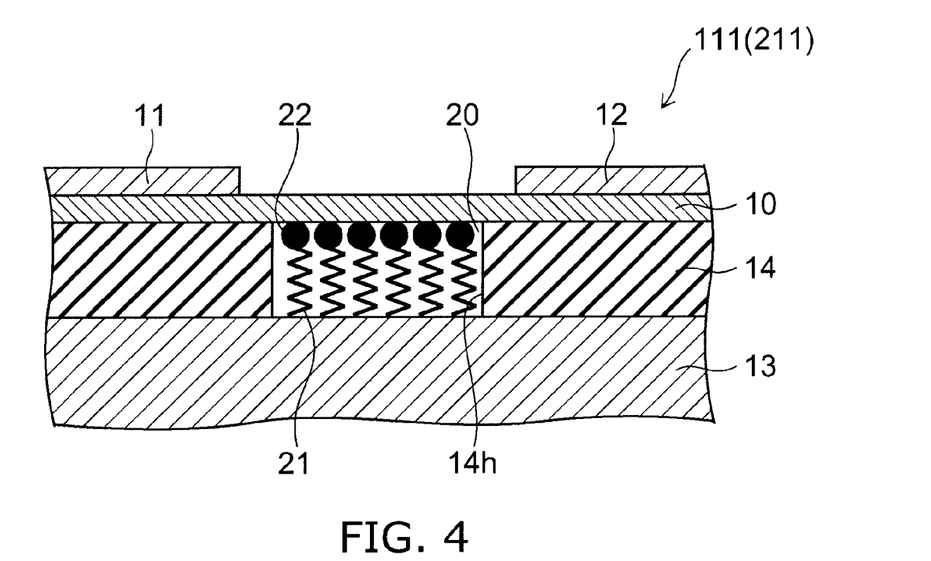
FIG. 4 is a schematic cross-sectional view illustrating the configuration of a switching device according to a first example of the invention.

FIG. 4 is a schematic cross-sectional view illustrating the configuration of the switching device according to the first example of the invention.

FIG. 4 also illustrates the configuration of the nonvolatile memory device according to this example.

Figure 5:
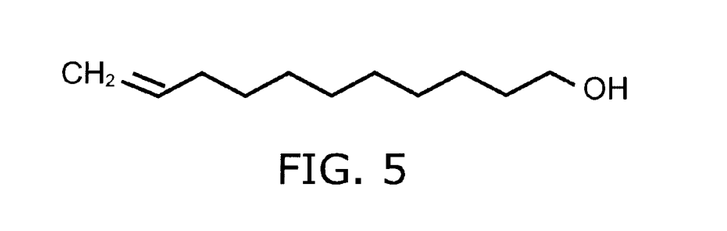
FIG. 5 is a schematic view illustrating the material used as a component of a portion of the switching device according to the first example of the invention.

FIG. 5 is a schematic view illustrating the material used as a component of a portion of the switching device according to the first example of the invention.

As illustrated in FIG. 4, a switching device 111 and a nonvolatile memory device 211 according to the first example of the invention include the first layer 10, the second layer 20, the first electrode 11, the second electrode 12, and the third electrode 13.

In this example, the second electrode 12 is provided on the same major surface of the first layer 10 where the first electrode 11 is provided; and the third electrode 13 is provided on a major surface of the first layer 10 on the side opposite to the major surface where the second electrode 12 and the first electrode 11 are provided.

In other words, an insulating film 14 made of a silicon oxide film including an opening 14h is provided on the third electrode 13 made of a silicon substrate, and the second layer 20 is filled into the interior of the opening 14h of the insulating film 14.

The first layer 10 made of graphene is provided on the insulating film 14 and the second layer 20 (on the side opposite to the third electrode 13). The first electrode 11 and the second electrode 12 are provided apart from each other on the first layer 10 (on the side opposite to the insulating film 14). In other words, the opening 14h of the insulating film 14, i.e., the second layer 20, is disposed between the first electrode 11 and the second electrode 12 as viewed from a direction perpendicular to the major surfaces of the first electrode 11 and the second electrode 12 (the faces opposing the insulating film 14).

An organic monolayer film based on 10-undecen-1-ol is used as the second layer 20.

As illustrated in FIG. 5, 10-undecen-1-ol has a vinyl group at one end and a hydroxyl group at the other end. The hydroxyl group forms the functional group portion 22. The portion of the 10-undecen-1-ol excluding the hydroxyl group forms the base portion 21.

As illustrated in FIG. 4, the hydroxyl group of the 10-undecen-1-ol of the second layer 20 (the functional group portion 22) is disposed to oppose the first layer 10. The base portion 21 is disposed on the third electrode 13 side. In other words, the functional group portion 22 is bonded to the base portion 21 and provided between the base portion 21 and the first layer 10.

In such a case, the double bond of the vinyl group of the one end of the 10-undecen-1-ol (i.e., the end of the base portion 21 on the side opposite to the functional group portion 22) reacts with the silicon of the third electrode 13; and the end of the vinyl group side of the base portion 21 is bonded to the third electrode 13 and fixed.

The switching device 111 and the nonvolatile memory device 211 having such a configuration may be fabricated, for example, as recited below.

FIGS. 6A to 6D are schematic cross-sectional views in order of the processes, illustrating a method for manufacturing the switching device according to the first example of the invention.

Figure 6A:
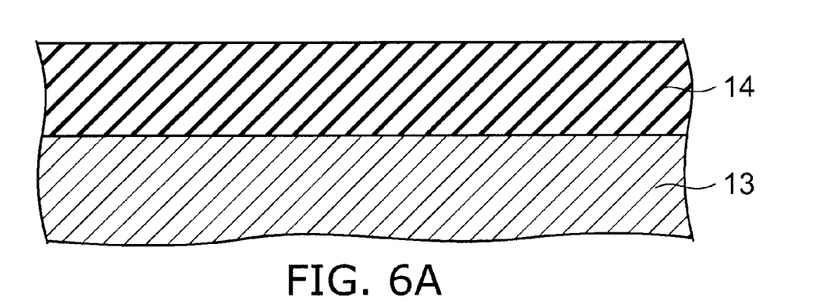
FIGS. 6A to 6D are schematic cross-sectional views in order of the processes, illustrating a method for manufacturing the switching device according to the first example of the invention.

FIGS. 6A to 6D also illustrate a method for manufacturing the nonvolatile memory device according to this example. As illustrated in FIG. 6A, the insulating film 14 made of the silicon oxide film is formed on the silicon substrate, i.e., the third electrode 13.

The thickness of the insulating film 14 is made to be substantially the same as the thickness of the second layer 20 (the organic monolayer film) formed subsequently. Namely, the insulating film 14 is deposited with a thickness in the range of, for example, 0.5 nm to 1 nm.

Figure 6B:
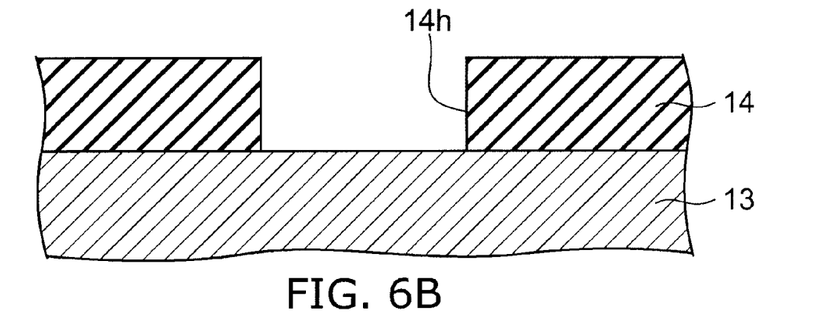

As illustrated in FIG. 6B, the insulating film 14 is patterned, a portion of the insulating film 14 is selectively removed to form the opening 14h, and the surface of the third electrode 13 is exposed. The surface of the third electrode 13 exposed by the opening 14h is a surface of hydrogen-terminated silicon.

Figure 6C:
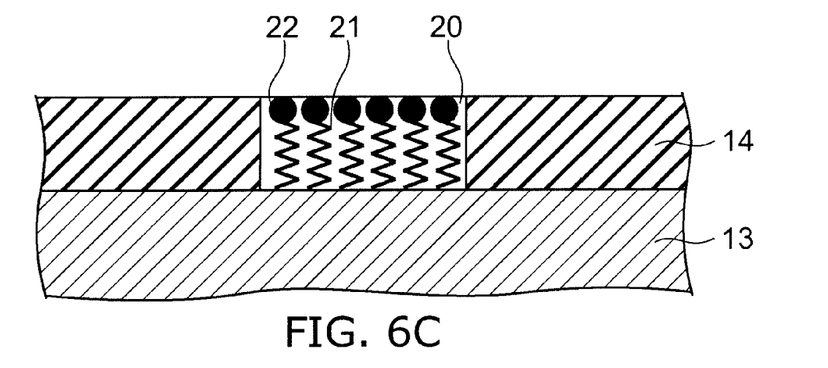

Then, as illustrated in FIG. 6C, an organic monolayer film is selectively formed on the surface of the hydrogen-terminated silicon of the third electrode 13 in the opening 14h. Namely, a self-assembled monolayer film (SAM) formed of 10-undecen-1-ol molecules is selectively formed.

Specifically, the third electrode 13 including the patterned insulating film 14 is immersed in a solution including 10-undecen-1-ol. The solution may include 10-undecen-1-ol dissolved in an organic solvent such as mesitylene. Then, the third electrode 13 including the insulating film 14 is removed from the solution and then heated or irradiated with ultraviolet light or visible light. Thereby, the vinyl groups in the organic molecules react with the hydrogen-terminated silicon of the third electrode 13, and the organic molecules are linked to the silicon surface by Si—C bonds. Such a reaction does not occur on the silicon oxide film, i.e., the insulating film 14. Therefore, the organic monolayer film can be selectively formed only on the hydrogen-terminated silicon. The hydrogen-terminated silicon reacts with the vinyl group. Therefore, the organic monolayer film is formed with a structure in which the hydroxyl group positioned on the side opposite to the vinyl group is disposed on the side opposite to the third electrode 13.

Subsequently, the organic molecules physically adsorbed to the surface of the insulating film 14 and the surface of the organic monolayer film are removed by, for example, ultrasonic cleaning. Thereby, the second layer 20 can be fabricated.

Figure 6D:
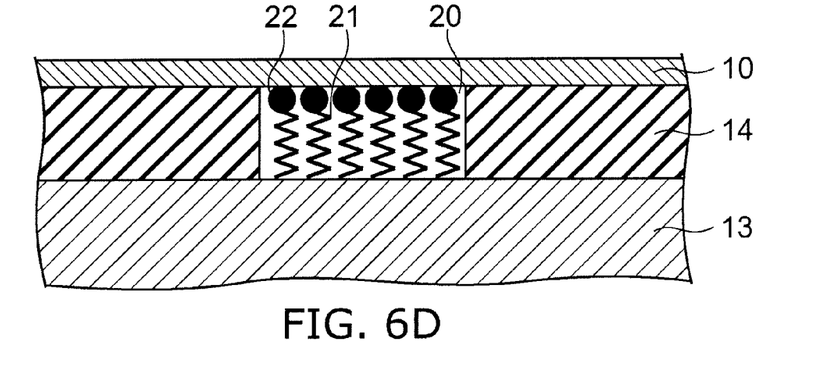

Continuing as illustrated in FIG. 6D, graphene forming the first layer 10 is deposited on the insulating film 14 and the second layer 20. The graphene is single-layered or multiple-layered graphene.

Then, after depositing, for example, Ti and Au on the first layer 10 in this order, the first electrode 11 and the second electrode 12 are formed by a lift-off process, and the switching device 111 and the nonvolatile memory device 211 illustrated in FIG. 4 can be fabricated.

In the switching device 111 and the nonvolatile memory device 211 thus fabricated, the third electrode 13 made of the silicon substrate corresponds to a gate electrode; the first layer 10 made of the graphene corresponds to a channel; and the first electrode 11 and the second electrode 12 made of Al/Ti stacked films correspond to a source electrode and a drain electrode, respectively. By applying a voltage to the gate electrode, the adsorption/desorption reaction occurs between the graphene and the hydroxyl group in the organic monolayer film. An oxidation-reduction reaction is one example of an adsorption/desorption reaction.

The reaction in such a case is represented by, for example, Formula I recited below.

(1)

Here, R represents the portion of the 10-undecen-1-ol other than the hydroxyl group. C is the carbon atom in the graphene.

In such a case, the sp²-bonded carbon in the graphene with the hydroxyl group by an oxidation reaction, and the bonded carbon changes to sp³ bonds. Then, the hydroxyl group desorbs and the carbon returns to sp²-bonded carbon by a subsequent reduction reaction. The ratio of the sp³-bonded carbon and the sp²-bonded carbon in the graphene can be reversibly changed by such adsorption/desorption reactions to form a switching device and a nonvolatile memory device by the principle described above.

Second Example

Figure 7:
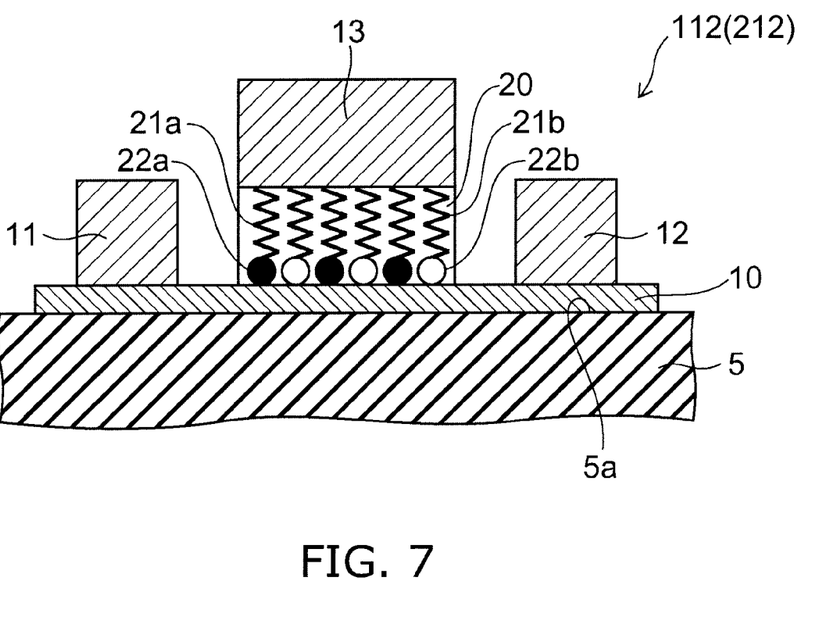
FIG. 7 is a schematic cross-sectional view illustrating the configuration of a switching device according to a second example of the invention.

FIG. 7 is a schematic cross-sectional view illustrating the configuration of a switching device according to a second example of the invention.

FIG. 7 also illustrates the configuration of a nonvolatile memory device according to this example.

As illustrated in FIG. 7, in a switching device 112 and a nonvolatile memory device 212 according to the second example, the first electrode 11 and the second electrode 12 are provided on the first layer 10 made of graphene provided on the substrate 5. The second layer 20 is provided on the first layer 10 between the first electrode 11 and the second electrode 12, and the third electrode 13 is provided thereupon. Single-layer or multiple-layer graphene may be used as the first layer 10.

An organic mixed monolayer film is used as the second layer 20. The organic mixed monolayer film is formed of two types of organic molecules. The functional group for adsorbing to or desorbing from the graphene of the first layer 10 differs with the respective molecule. Specifically, one of the molecules forming the organic mixed monolayer film has a hydroxyl group at one end, and the other molecule has a nitro group at one end. The hydroxyl group forms one of a functional group portion 22a and a functional group portion 22b, and the nitro group forms the other one of the functional group portion 22a and the functional group portion 22b.

Thus, the functional group portion 22 includes a first functional group (the functional group portion 22a) and a second functional group (the functional group portion 22b) having a structure different from that of the first functional group.

The functional group portion 22a and the functional group portion 22b oppose the first layer 10 while being bonded to a base portion 21a and a base portion 21b, respectively.

The distance between the functional group portion and the carbon atoms 10a of the first layer 10 can be controlled by the gate voltage applied between the first layer 10 and the third electrode 13 also in the case where a nitro group is used as the functional group portion. The functional group portion is adsorbed to or desorbed from the carbon atoms 10a; and thereby, the electrical conductivity of the first layer 10 can be controlled.

The switching device 112 and the nonvolatile memory device 212 having such a configuration may be fabricated, for example, as recited below.

FIGS. 8A to 8D are schematic cross-sectional views in order of the processes, illustrating a method for manufacturing a switching device according to the second example of the invention.

Figure 8A:
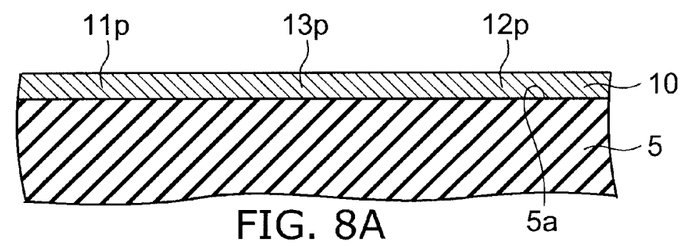
FIGS. 8A to 8D are schematic cross-sectional views in order of the processes, illustrating a method for manufacturing the switching device according to the second example of the invention.

FIGS. 8A to 8D also illustrate a method for manufacturing a nonvolatile memory device according to this example. As illustrated in FIG. 8A, graphene forming the first layer 10 is epitaxially grown on the substrate 5 made of silicon carbide and patterned into a structure including a source portion 11p where a source electrode is subsequently disposed, a drain portion 12p where a drain electrode is subsequently disposed, and a channel portion 13p subsequently forming a channel.

Figure 8B:
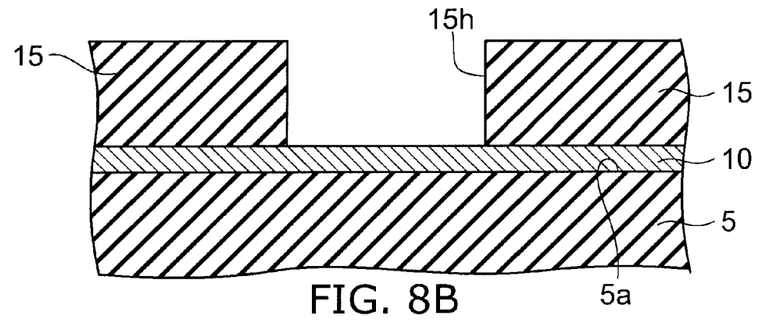

Then, as illustrated in FIG. 8B, a resist 15 having an opening 15h is formed.

Figure 8C:
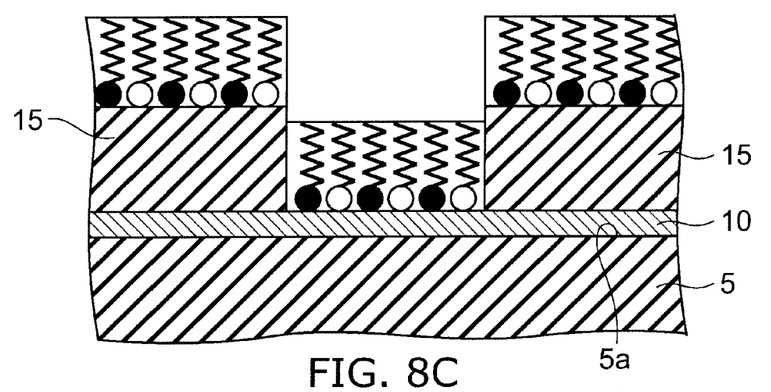

Continuing as illustrated in FIG. 8C, an organic mixed monolayer film forming the second layer 20 is formed on the resist 15 and the first layer 10 exposed by the opening 15h by, for example, a Langmuir-Blodgett method. Subsequently, the resist 15 and the organic mixed monolayer film on the resist 15 are removed.

Figure 8D:
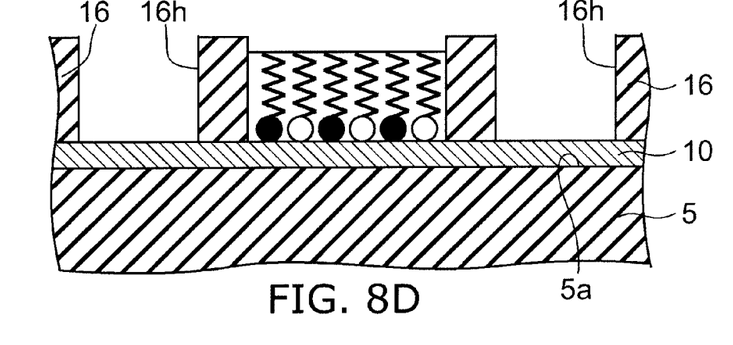

Then, as illustrated in FIG. 8D, a resist 16 including prescribed openings 16h is formed on the portions excluding the second layer 20. A conducting film is formed on the first layer 10 exposed by the openings 16h and on the second layer 20. Metal and/or polysilicon may be used as the conducting film. The conducting film filled into the portions of the openings 16h forms the first electrode 11 and the second electrode 12. The conducting film formed on the second layer 20 forms the third electrode 13.

Thus, the switching device 112 and the nonvolatile memory device 212 illustrated in FIG. 7 can be formed.

In the switching device 112 and the nonvolatile memory device 212, the third electrode 13 corresponds to the gate electrode; the first layer 10 made of graphene corresponds to the channel; and the first electrode 11 and the second electrode 12 correspond to the source electrode and the drain electrode, respectively.

By applying a gate voltage to the gate electrode in the switching device 112 and the nonvolatile memory device 212, the functional group portion 22a and the functional group portion 22b in the organic mixed monolayer film are adsorbed to or desorbed from the carbon atoms 10a of the graphene, and the electrical conductivity of the graphene, i.e., the first layer 10, changes.

Figure 9:
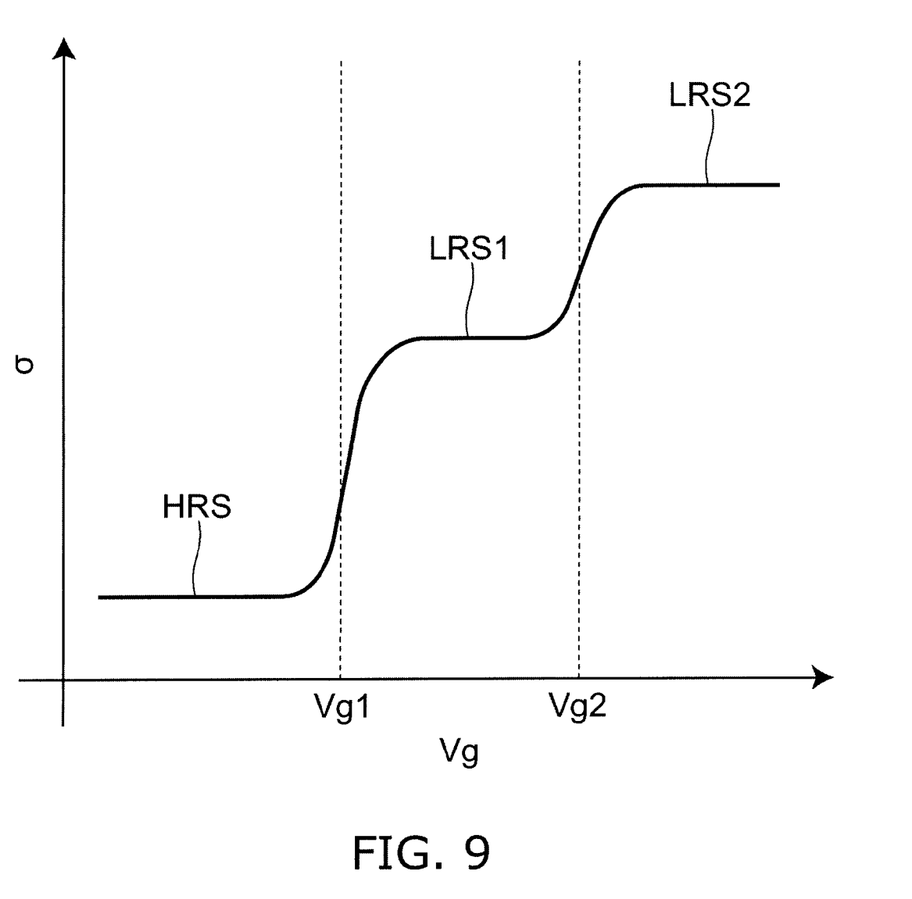
FIG. 9 is a schematic graph illustrating characteristics of the switching device according to the second example of the invention.

FIG. 9 is a schematic graph illustrating characteristics of the switching device according to the second example of the invention.

FIG. 9 also illustrates characteristics of the nonvolatile memory device according to this example. In FIG. 9, a gate voltage Vg applied to the third electrode 13 (the gate electrode) is plotted on the horizontal axis, and an electrical conductivity a of the graphene, i.e., the first layer 10, is plotted on the vertical axis.

As illustrated in FIG. 9, the electrical conductivity a increases in two stages as the gate voltage Vg increases. In this example, the organic mixed monolayer film, i.e., the second layer 20, includes two types of functional group portions, i.e., the functional group portion 22a and the functional group portion 22b. The adsorption/desorption reactions of the functional group portion 22a and the functional group portion 22b are cause to occur by mutually different values of the gate voltage Vg. Accordingly, the electrical conductivity a changes in two stages to accompany the change of the gate voltage Vg.

In other words, for example, when the gate voltage Vg is low, both of the functional groups in the organic mixed monolayer film (the functional group portion 22a and the functional group portion 22b) are adsorbed to the carbon atoms 10a of the graphene of the first layer 10, and the ratio of $sp^3$-bonded carbon is high. Therefore, the electrical conductivity a of the graphene is low in a high resistance state HRS.

When the gate voltage Vg increases to a first gate voltage Vg1, one of the functional group portions in the organic mixed monolayer film, e.g., the functional group portion 22a, desorbs from the graphene, and the carbon that was bonded to the functional group portion 22a changes from $sp^3$ bonds to $sp^2$ bonds. As a result, the electrical conductivity σ of the graphene increases, and the high resistance state HRS transforms to a first low resistance state LRS1.

Then, when the gate voltage Vg increases further to a second gate voltage Vg2, the other functional group portion 22b in the organic mixed monolayer film starts to desorb from the graphene. At this time, the electrical conductivity a of the graphene increases further, and the graphene transforms from the first low resistance state LRS1 to a second low resistance state LRS2 having an even lower resistance.

In other words, the electrical conductivity of the graphene can be changed in stages by multiple types of molecules included in the organic mixed monolayer film, and a so-called multi-bit operation is possible. Although two types of molecules are included in the organic mixed monolayer film in this example, three or more types may be used. As long as two or more types of molecules form the second layer 20, the multi-bit operation can be realized by changing the electrical conductivity in stages by the method described above.

Thus, in the second layer 20, organic monolayer films of various configurations may be used. It is unnecessary that all of the molecules included in the organic monolayer film include a reactive functional group portion 22. For example, an organic mixed monolayer film including molecules having reactive functional group portions 22 mixed with inactive molecules may be used.

Third Example

Figure 10:
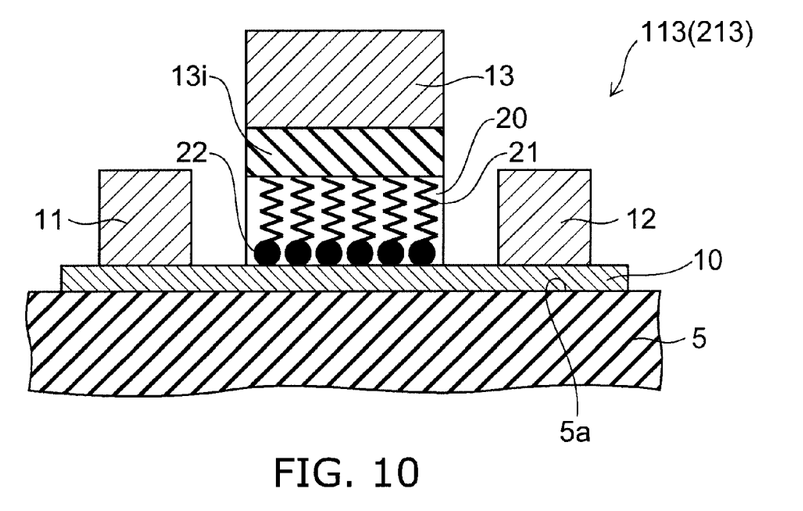
FIG. 10 is a schematic cross-sectional view illustrating the configuration of a switching device according to a third embodiment of the invention.

FIG. 10 is a schematic cross-sectional view illustrating the configuration of a switching device according to a third embodiment of the invention.

FIG. 10 also illustrates the configuration of a nonvolatile memory device according to this example.

As illustrated in FIG. 10, a switching device 113 and a nonvolatile memory device 213 according to this example further include an insulating layer 13i provided between the second layer 20 and the third electrode 13. Otherwise, the switching device 113 and the nonvolatile memory device 213 may be similar to the switching device 110 and the nonvolatile memory device 210 illustrated in FIG. 1, and a description is omitted.

An organic material such as a polymer may be used for the insulating layer 13i. Metal oxides such as silicon oxide, metal nitride, metal oxynitride, and the like also may be used.

Thus, even in the case where the insulating layer 13i is provided between the second layer 20 and the third electrode 13, the functional group portion 22 of the second layer 20 opposes the first layer 10 while being bonded to the base portion 21.

Using the insulating layer 13i provides the advantages that the insulative properties between the first layer 10 and the third electrode 13 can be improved, the characteristics can be stabilized, the reliability can be improved further, and the power can be reduced.

The insulating layer 13i provided between the second layer 20 and the third electrode 13 also can be applied to the configurations of the switching devices 111 and 112 and the nonvolatile memory devices 211 and 212 of the first and second examples.

Fourth Example

Figure 11:
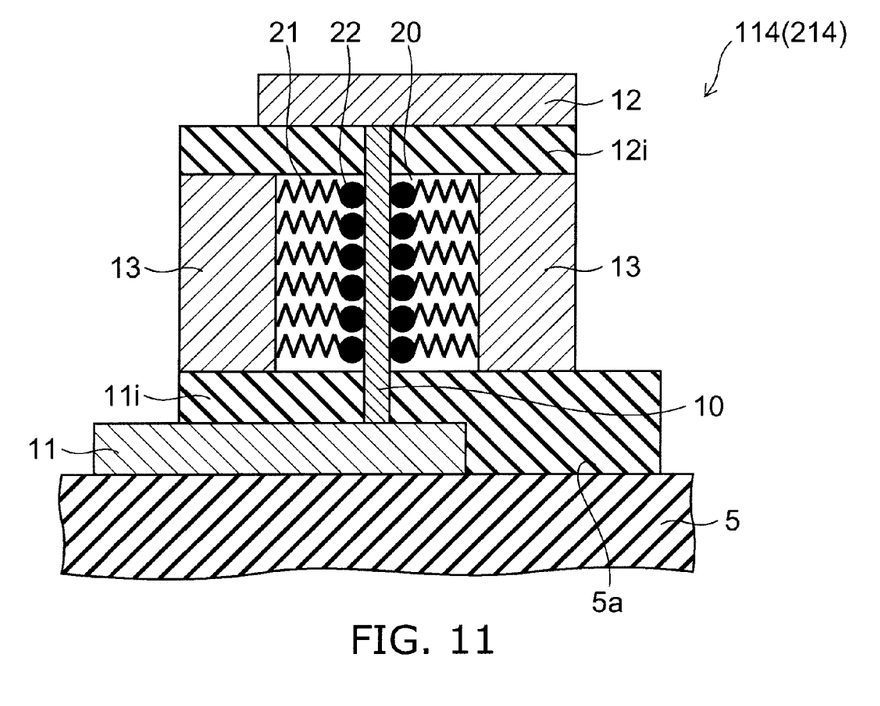
FIG. 11 is a schematic cross-sectional view illustrating the configuration of a switching device according to a fourth example of the invention.

FIG. 11 is a schematic cross-sectional view illustrating the configuration of a switching device according to a fourth example of the invention.

FIG. 11 also illustrates the configuration of a nonvolatile memory device according to this example.

In a switching device 114 and a nonvolatile memory device 214 according to this example illustrated in FIG. 11, the first electrode 11 is provided on the substrate 5; the first layer 10 is provided on the first electrode 11 to align in a direction perpendicular to the major surface 5a of the substrate 5; the second electrode 12 is provided on the upper side of the first layer 10 (the side opposite to the first electrode 11); the second layer 20 is provided between the first electrode 11 and the second electrode 12 to enclose the first layer 10; and the third electrode 13 is provided to enclose the second layer 20. An insulating film 11i is provided between the first electrode 11 and the second layer 20 and between the first electrode 11 and the third electrode 13. An insulating film 12i is provided between the second electrode 12 and the second layer 20 and between the second electrode 12 and the third electrode 13. Thus, in the switching device 114 and the nonvolatile memory device 214, an insulating film may be further provided between the second layer 20 and at least one selected from the first electrode 11 and the second electrode 12 and between the third electrode 13 and at least one selected from the first electrode 11 and the second electrode 12.

In such a case as well, the second layer 20 is provided between the first layer 10 and the third electrode 13 and includes the base portion 21 and the functional group portion 22. The functional group portion 22 is provided between the base portion 21 and the first layer 10 and bonded to the base portion 21. The ratio of the $sp^2$-bonded carbon and the $sp^3$-bonded carbon of the first layer 10 is changeable by the functional group portion 22 by changing the distance between the functional group portion 22 and the carbon atoms in the first layer 10.

The switching device 114 and the nonvolatile memory device 214 have a so-called vertical structure in which the first layer 10 forming the channel is aligned in the direction perpendicular to the major surface 5a of the substrate 5. The switching device 114 and the nonvolatile memory device 214 also have a so-called gate-all-around (GAA) structure in which the third electrode 13 forming the gate electrode is provided to enclose the first layer 10 forming the channel.

In the case where carbon nanotubes are used as the first layer 10, in such a vertical structure, particularly by using the gate-all-around structure, the third electrode 13, i.e., the gate electrode, can enclose the side faces of the carbon nanotubes to efficiently control the electrical conductivity a of the channel.

The insulating layer 13i may be provided between the second layer 20 and the third electrode 13 also in the switching device 114 and the nonvolatile memory device 214 of the vertical structure.

A so-called double-gate structure may be used in the planar switching devices 110, 111, 112, and 113 and the nonvolatile memory devices 210, 211, 212, and 213 illustrated in FIG. 1, FIG. 4, FIG. 7, and FIG. 10 where both the second layer 20 and the third electrode 13 are provided on both the upper side and the lower side of the first layer 10.

In vertical switching devices and nonvolatile memory devices as well, in addition to the gate-all-around structure in which the second layer 20 and the third electrode 13 are provided to enclose the first layer 10, the double gate structure may be used in which both the second layer 20 and the third electrode 13 are provided on both of the side faces of the first layer 10.

Further, a so-called fin structure may be used in which the first electrode 11, the second electrode 12, and the first layer 10 provided therebetween are disposed substantially in the same plane, and the third electrode 13 is provided on the side face of the first layer 10. In such a case as well, the double-gate structure may be used in which both the second layer 20 and the third electrode 13 are provided on both of the side faces of the first layer 10.

Fifth Example

Figure 12:
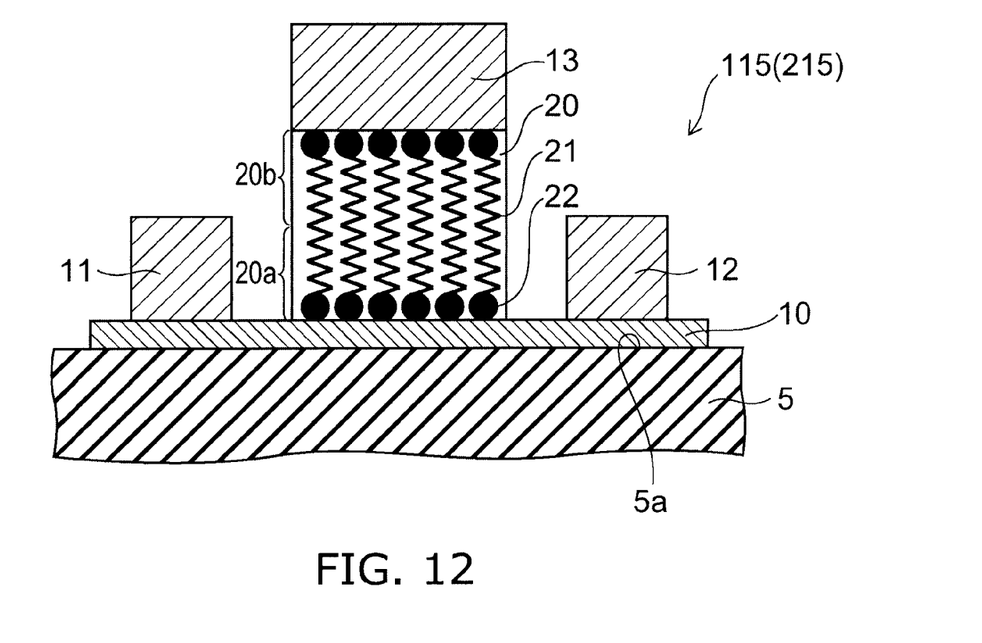
FIG. 12 is a schematic cross-sectional view illustrating the configuration of a switching device according to a fifth example of the invention.

FIG. 12 is a schematic cross-sectional view illustrating the configuration of a switching device according to a fifth example of the invention.

FIG. 12 also illustrates the configuration of a nonvolatile memory device according to this example.

As illustrated in FIG. 12, in a switching device 115 and a nonvolatile memory device 215 according to this example, the second layer 20 includes a multiple-layer structure made of organic molecules. Otherwise, the switching device 115 and the nonvolatile memory device 215 may be similar to the switching device 110 and the nonvolatile memory device 210 illustrated in FIG. 1, and a description is omitted.

In the second layer 20 of this example, a lower layer 20a and an upper layer 20b are stacked with the lower layer 20a on the first layer 10 side and the upper layer 20b on the third electrode 13 side. In the lower layer 20a, the functional group portion 22 bonded to the base portion 21 is disposed to oppose the first layer 10. On the other hand, in the upper layer 20b, the functional group portion 22 bonded to the base portion 21 is disposed to oppose the third electrode 13. The base portion 21 of the lower layer 20a and the base portion 21 of the upper layer 20b are disposed to oppose each other.

Thus, even in the case where the second layer 20 has the multiple-layer structure made of organic molecules, in the lower layer 20a of the second layer 20, the functional group portion 22 bonded to the base portion 21 is provided between the base portion 21 and the first layer 10; and the ratio of the $sp^2$-bonded carbon and the $sp^3$-bonded carbon of the first layer 10 is changeable by the functional group portion 22 by changing the distance between the functional group portion 22 and the carbon atoms in the first layer 10.

Thus, in the switching device and the nonvolatile memory device according to the embodiments of the invention, the configuration of the second layer 20 is arbitrary as long as the second layer 20 includes the base portion 21 and the functional group portion 22, where the functional group portion 22 makes the ratio of the $sp^2$-bonded carbon and the $sp^3$-bonded carbon of the first layer 10 changeable by being provided between the base portion 21 and the first layer 10, by being bonded to the base portion 21, and by changing the distance between the functional group portion 22 and the carbon atoms 10a in the first layer 10.

Sixth Example

Figure 13:
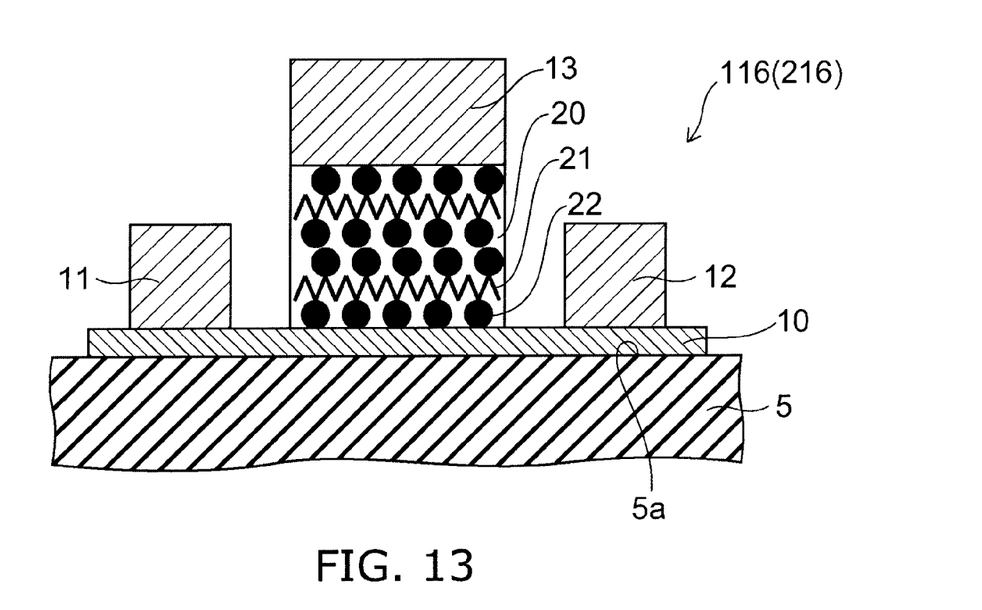
FIG. 13 is a schematic cross-sectional view illustrating the configuration of a switching device according to a sixth example of the invention.

FIG. 13 is a schematic cross-sectional view illustrating the configuration of a switching device according to a sixth example of the invention.

FIG. 13 also illustrates the configuration of a nonvolatile memory device according to this example.

In a switching device 116 and a nonvolatile memory device 216 according to this example illustrated in FIG. 13, an organic polymer is used as the second layer 20; a main chain of the organic polymer forms the base portion 21; and the functional group portion 22 is bonded to the main chain.

For example, in the case where an organic polymer having a benzene ring (a six-member ring) as the main chain is used, the benzene ring of the organic polymer is arranged along the six-member ring network structure of the first layer 10 due to interactions between the benzene ring of the organic polymer and the six-member ring of the first layer 10. In such a case, the functional group portion 22 bonded to the main chain opposes the first layer 10 with a constant proportion. In other words, in such a case as well, the ratio of the $sp^2$-bonded carbon and the $sp^3$-bonded carbon of the first layer 10 is changeable by the functional group portion 22 bonded to the base portion 21 (the main chain) and provided between the base portion 21 and the first layer 10 by changing the distance between the functional group portion 22 and the carbon atoms 10a in the first layer 10. The functional group portion 22 is bonded to the main chain, i.e., the base portion 21, and therefore can oppose the carbon atoms 10a of the first layer 10 with a constant density.

Thus, even in the case where a polymer is used as the second layer 20, a switching device and a nonvolatile memory device can be provided having high reliability and low fluctuation among devices.

In addition to a benzene ring, any heterocyclic and the like may be used as the main chain in the case where an organic polymer is used as the second layer 20. Also, any non-ring structure may be used as the main chain; a lamellar structure may be formed by interactions among the main chains; an arrangement of the lamellar structure may be arranged with respect to the surface of the first layer 10 such that the functional group portion 22 bonded to the main chain forming the base portion 21 opposes the first layer 10 with a constant density.

Although the case was described in the embodiments and the examples recited above where the distance between the carbon atoms 10a included in the first layer 10 and the functional group portion 22 of the second layer 20 was changed by applying an applied voltage (a gate voltage) between the first layer 10 and the third electrode 13 to control, for example, both the adsorption and the desorption reaction of the functional group portion 22, the invention is not limited thereto. For example, the adsorption of the functional group portion 22 may be implemented by applying a voltage to the third electrode 13, and the desorption may be implemented by so-called current cleaning in which a large current flows in the first layer 10 by applying a voltage between the first electrode 11 and the second electrode 12. In such a case, the adsorbed functional group portion 22 desorbs from the carbon atoms 10a of the first layer 10 by a Joule heat produced by the current flowing in the first layer 10.

In other words, in the switching device and the nonvolatile memory device according to the embodiments of the invention, the ratio of the $sp^2$-bonded carbon and the $sp^3$-bonded carbon of the first layer 10 is changeable by at least one selected from a voltage applied between the first layer 10 and the third electrode 13 and a current provided between the first electrode 11 and the second electrode 12.

Further, the switching device and the nonvolatile memory device described in the embodiments and the examples recited above may be multiply stacked to form a device having a stacked structure. Also, multiple switching devices and nonvolatile memory devices according to the embodiments of the invention may be provided and connected by various methods such as, for example, NAND, NOR, AND, DINOR, cross point, etc.

Hereinabove, exemplary embodiments of the invention are described with reference to specific examples. However, the invention is not limited to these specific examples. For example, one skilled in the art may appropriately select configurations, shapes, sizes, material qualities, arrangements, and the like of components such as electrodes, layers, insulating layers, insulating films, etc., or manufacturing methods of switching devices and nonvolatile memory devices from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all switching devices and nonvolatile memory devices practicable by an appropriate design modification by one skilled in the art based on the switching device and the nonvolatile memory devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

The invention claimed is:

1. A switching device, comprising:
   a first layer including a carbon material having a six-member ring network structure;
   a first electrode electrically connected to a first portion of the first layer;
   a second electrode electrically connected to a second portion of the first layer and provided apart from the first electrode;
   a third electrode including a fourth portion provided opposing a third portion between the first portion and the second portion of the first layer; and
   a second layer provided between the third portion of the first layer and the fourth portion of the third electrode, the second layer including one of a Langmuir-Blodgett film and a self-assembled monolayer,
   the one including:
      a base portion; and
      a functional group portion,
   the functional group portion being provided between the base portion and the first layer, the functional group portion being bonded to the base portion, a concentration of $sp^3$-bonded carbon of the first layer being changeable by a difference between a potential of the first layer and a potential of the third electrode, the $sp^3$-bonded carbon being bonded to the functional group.

2. The device according to claim 1, wherein the concentration of $sp^3$-bonded carbon is changeable by at least one selected from an adsorption reaction and a desorption reaction of the functional group portion with carbon atoms of the first layer occurring by the difference between the potential of the first layer and the potential of the third electrode.

3. The device according to claim 1, wherein the first layer includes at least one selected from graphite and carbon nanotubes.

4. The device according to claim 1, wherein the functional group portion includes at least one functional group selected from the group consisting of hydroxyl group, carboxyl group, aldehyde group, amino group, nitro group, nitroso group, isocyano group, cyano group, thiol group, phosphonic acid group, vinyl group, and epoxy group.

5. The device according to claim 1, wherein the functional group portion includes a first functional group and a second functional group having a different structure than the first functional group.

6. The device according to claim 1, wherein an electrical conductivity of the first layer changes by a change of the concentration of $sp^3$-bonded carbon of the first layer.

7. The device according to claim 1, wherein a change of the concentration of $sp^3$-bonded carbon of the first layer is reversible.

8. The device according to claim 1, further comprising an insulating layer provided between the second layer and the third electrode.

9. A nonvolatile memory device, comprising: memory cells, each of the memory cells including the device according to claim 1, a change of an electrical conductivity of the first layer accompanying the change of the concentration of $sp^3$-bonded carbon being maintainable as stored data.

10. A switching device, comprising:
a first layer including a carbon material having a six-member ring network structure;
a first electrode electrically connected to a first portion of the first layer;
a second electrode electrically connected to a second portion of the first layer and provided apart from the first electrode;
a third electrode including a fourth portion provided opposing a third portion between the first portion and the second portion of the first layer; and
a second layer provided between the third portion of the first layer and the fourth portion of the third electrode, the second layer including one of a Langmuir-Blodgett film and a self-assembled monolayer,
the one including:
a base portion; and
a functional group portion,
the functional group portion being provided between the base portion and the first layer, the functional group portion being bonded to the base portion, a concentration of $sp^3$-bonded carbon of the first layer being changeable by a current flowing in the first layer via the first electrode and the second electrode, the $sp^3$-bonded carbon being bonded to the functional group.

11. The device according to claim 10, wherein the concentration of $sp^3$-bonded carbon is changeable by at least one selected from an adsorption reaction and a desorption reaction of the functional group portion with carbon atoms of the first layer occurring by the current flowing in the first layer via the first electrode and the second electrode.

12. The device according to claim 10, wherein the first layer includes at least one selected from graphite and carbon nanotubes.

13. The device according to claim 10, wherein the functional group portion includes at least one functional group selected from the group consisting of hydroxyl group, carboxyl group, aldehyde group, amino group, nitro group, nitroso group, isocyano group, cyano group, thiol group, phosphonic acid group, vinyl group, and epoxy group.

14. The device according to claim 10, wherein the functional group portion includes a first functional group and a second functional group having a different structure than the first functional group.

15. The device according to claim 10, wherein an electrical conductivity of the first layer changes by a change of the concentration of $sp^3$-bonded carbon of the first layer.

16. The device according to claim 10, wherein a change of the concentration of $sp^3$-bonded carbon of the first layer is reversible.

17. The device according to claim 10, further comprising an insulating layer provided between the second layer and the third electrode.

18. A nonvolatile memory device, comprising: memory cells, each of the memory cells including the device according to claim 10, a change of an electrical conductivity of the first layer accompanying the change of the concentration of $sp^3$-bonded carbon being maintainable as stored data.

* * * * *